US011309836B1

(12) United States Patent
Lin

(10) Patent No.: US 11,309,836 B1
(45) Date of Patent: Apr. 19, 2022

(54) DIFFERENTIAL CRYSTAL OSCILLATOR WITH LARGE VOLTAGE SWING

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 17/391,113

(22) Filed: Aug. 2, 2021

(51) Int. Cl.
*H03B 5/36* (2006.01)
*H03B 5/12* (2006.01)

(52) U.S. Cl.
CPC ........... *H03B 5/364* (2013.01); *H03B 5/1215* (2013.01); *H03B 5/366* (2013.01); *H03B 2200/009* (2013.01)

(58) Field of Classification Search
CPC ...... H03B 5/364; H03B 5/1215; H03B 5/366; H03B 2200/009
USPC .......................................... 331/158, 116 FE
See application file for complete search history.

(56) References Cited

U.S. PATENT DOCUMENTS 7,071,788 B2 * 7/2006 Guebels .................. H03B 5/36
331/116 FE
2017/0317645 A1 * 11/2017 Srinivas .................. H03B 1/04

OTHER PUBLICATIONS

Rajavi, et al.: "A 48-MHz Differential Crystal Oscillator With 168-fs Jitter in 28-nm CMOS"; IEEE Journal of Solid-State Circuits, vol. 52, No. 10, Oct. 2017; pp. 2735-2745.

* cited by examiner

*Primary Examiner* — Arnold M Kinkead
(74) *Attorney, Agent, or Firm* — McClure, Qualey & Rodack, LLP

(57) ABSTRACT

A differential crystal oscillator includes a source follower configured to receive an oscillatory signal and output a regenerated signal; a resonant network having a crystal and configured to terminate the oscillatory signal and determine an oscillation frequency of the oscillatory signal; a regenerative network configured to regenerate the regenerated signal; and a capacitive feedback network configured to provide a feedback from the regenerated signal to the oscillatory signal.

16 Claims, 3 Drawing Sheets

DIFFERENTIAL CRYSTAL OSCILLATOR WITH LARGE VOLTAGE SWING

BACKGROUND OF THE DISCLOSURE

Field of the Disclosure

This present disclosure generally relates to crystal oscillators, and particularly to differential crystal oscillators with large voltage swing and low phase noise.

Description of Related Art

As is known, crystal oscillators are an important circuit for numerous applications. Most crystal oscillators are based on a single-ended circuit topology. However, a single-ended crystal oscillator is prone to generating a rich number of harmonic spurs that may cause a detrimental interference with other circuits. A differential crystal oscillator can effectively mitigate the harmonic spurs and thus be desirable. However, a differential crystal oscillator may be prone to being latched and failing to oscillate. As described in "A 48-MHz Differential Crystal Oscillator With 168-fs Jitter in 28-nm CMOS" published in IEEE Journal of Solid-State Circuits, VOL. 52, NO. 10, October 2017, Rajavi et al present a differential crystal oscillator 100 (as depicted in FIG. 1).

Differential crystal oscillator 100 comprises: a resonant network 110 comprising a crystal 113 and two shunt capacitors 111 and 112 and configured to determine a frequency of an oscillatory signal $V_{osc}$ which in a differential signal embodiment comprises two voltages $V_{osc+}$ and $V_{osc-}$ at two nodes 101 and 102, respectively; a regenerative network comprising two NMOS (n-channel metal oxide semiconductor) transistors 121 and 122 configured in cross-coupling capacitor across the two nodes 101 and 102 to sustain an oscillation of the oscillatory signal $V_{osc}$; a first active inductor 130 comprising PMOS (p-channel metal oxide semiconductor) transistor 131 and resistor 132 coupled to node 101; and a second active inductor 140 comprising PMOS transistor 141 and resistor 142 coupled to node 102. Throughout this disclosure, "$V_{DD}$" denotes a power supply node. Operating principles of a differential crystal oscillator 100 is explained in detail in the aforementioned paper and thus not explained in detail here.

A drawback of differential crystal oscillator 100 is that a swing of the two voltages $V_{osc+}$ and $V_{osc-}$ is limited. Although $V_{osc+}$ ($V_{osc-}$) can be pulled down effectively by NMOS transistor 122 (121) and can be pulled up by PMOS transistor 131 (141), the pull-up is not effective since PMOS transistor 131 (141) is configured in a "diode-connect" topology and has a diminishing pull-up capability as $V_{osc+}$ ($V_{osc-}$) is being pulled up. A phase noise of the oscillatory signal $V_{osc}$ is highly dependent on the swing of the two voltages $V_{osc+}$ and $V_{osc-}$. Due to this effective pull-up capability to allow the two voltages $V_{osc+}$ and $V_{osc-}$ to have a large swing, a performance (regarding phase noise) that differential crystal oscillator 100 can achieve is inherently limited.

What is desired is a differential crystal oscillator that allows a large swing of an oscillatory signal and thus a low phase noise.

SUMMARY OF THE DISCLOSURE

In an embodiment, a differential crystal oscillator comprises: a the first source follower comprising a first MOS (metal oxide semiconductor) transistor and a second MOS transistor of a first type configured to receive an oscillatory signal comprising a first voltage and a second voltage at a first node and a second node, respectively, and output a regenerated signal comprising a third voltage and a fourth voltage at a third node and a fourth node, respectively; a regenerative network comprising a third MOS transistor and a fourth MOS transistor of the first type configured in a cross-coupling topology between the third node and the fourth node to regenerate the regenerated signal; a capacitive feedback network comprises a first capacitor and a second capacitor configured to couple the first node and the second node to the third node and the fourth node, respectively and a third capacitor and a fourth capacitor configured to shunt the third node and the fourth node, respectively, to ground; a first DC (direct current) coupling resistor and a second DC coupling resistor configured to couple a first bias voltage to the first node and the second node, respectively; and a resonant network comprising a crystal placed between the first node and the second node.

In an embodiment, a differential crystal oscillator comprises: a source follower configured to receive an oscillatory signal and output a regenerated signal; a resonant network comprising a crystal and configured to terminate the oscillatory signal and determine an oscillation frequency of the oscillatory signal; a regenerative network configured to regenerate the regenerated signal; and a capacitive feedback network configured to provide a feedback from the regenerated signal to the oscillatory signal.

DETAILED DESCRIPTION OF THIS DISCLOSURE

Figure 1:
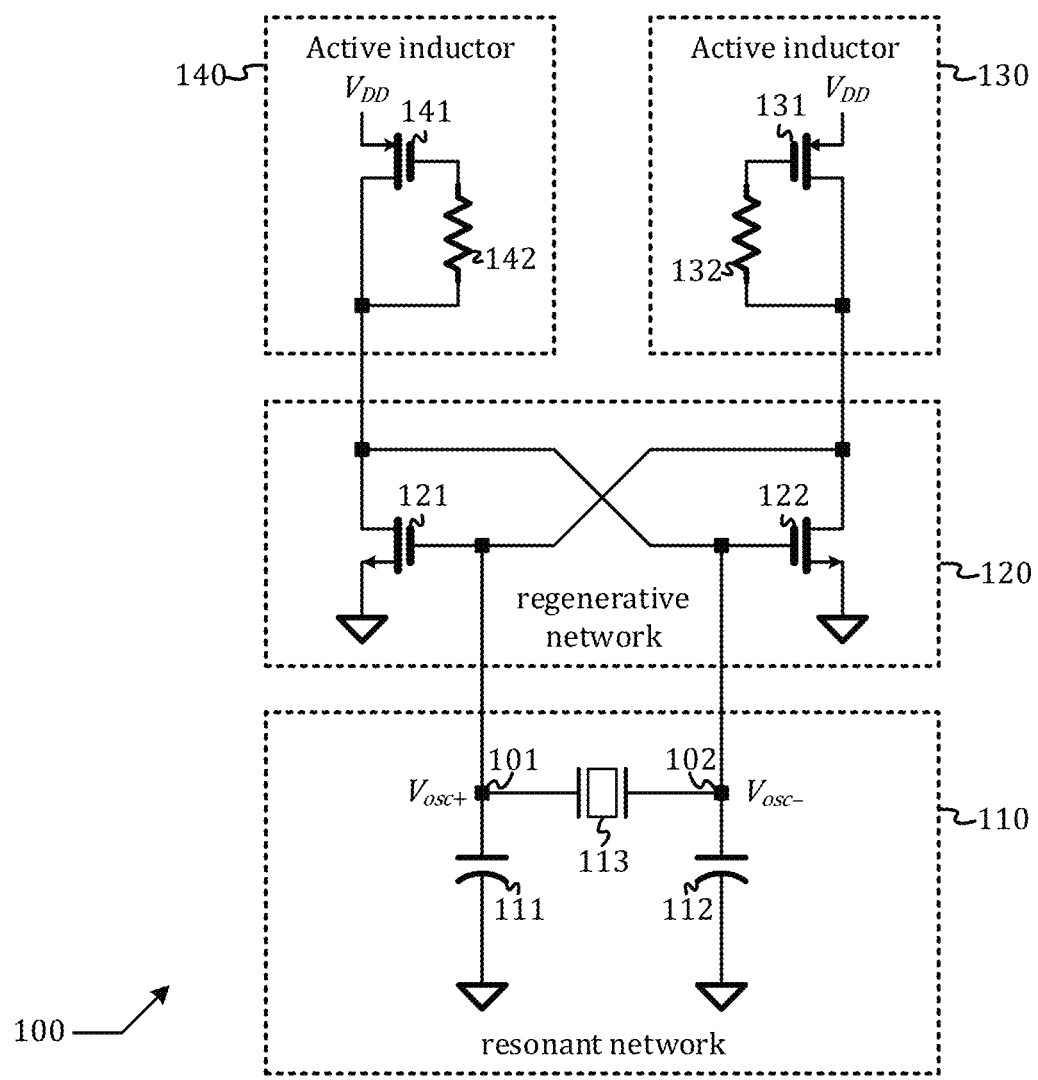
FIG. 1 shows a schematic diagram of a prior art differential crystal oscillator.

The present disclosure is directed to differential crystal oscillators. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "crystal," "voltage," "signal," "differential signal," "bias," "DC (direct current)," "AC (alternate current)," "capacitor," "resistor," "the first source follower," "parallel connection," "circuit node," "ground," "power supply," "MOS (metal oxide semiconductor) transistor," "CMOS (complementary metal oxide semiconductor) process technology," "NMOS (n-channel metal oxide semiconductor) transistor," and "PMOS (p-channel metal oxide semiconductor) transistor." Terms and basic concepts like these, when used in a context of microelectronics, are apparent to those of ordinary skill in the art and thus will not be explained in detail here.

Those of ordinary skills in the art understand units such as pF (pico-Farad), nm (nanometer), µm (micron), and KOhm (kilo-Ohm) without a need of explanations.

Those of ordinary skills in the art can read schematics of a circuit comprising electronic components such as capacitors, resistors, NMOS transistors, PMOS transistors, and so on, and do not need a verbose description about how one component connects with another in the schematics. Those of ordinary skill in the art can also recognize a ground symbol, a capacitor symbol, a resistor symbol, and symbols of PMOS transistor and NMOS transistor, and identify the "source terminal," the "gate terminal," and the "drain terminal" thereof. Pertaining to a MOS transistor, for brevity, hereafter, "source terminal" is simply referred to as "source," "gate terminal" is simply referred to as "gate," and "drain terminal" is simply referred to "drain."

A MOS transistor, PMOS or NMOS, has a threshold voltage. A MOS transistor is turned on when its gate-to-source voltage is larger than its threshold voltage (in absolute value). When a MOS transistor is turned on, a difference between its gate-to-source voltage and its threshold voltage in absolute value is referred to as an "over-drive voltage." A MOS transistor is in a "saturation region" when it is turned on and its over-drive voltage is larger than its drain-to-source voltage (in absolute value). A MOS transistor is an effective gain device only when it is in the "saturation region"; when that happens, said MOS transistor is said to be biased in the saturation region.

A source follower comprises a MOS transistor configured to receive an input voltage from a gate of said MOS transistor and output voltage via a source of said MOS transistor. A MOS transistor can effectively embody a source follower only when biased in the saturation region.

In this disclosure, one of a NMOS transistor and a PMOS transistor is referred to a MOS transistor of a first type, while the other is referred to a MOS transistor of a second type. In an embodiment, a NMOS transistor is referred to as a MOS transistor of a first type, while a PMOS transistor is referred to as a MOS transistor of a second type. In an alternative embodiment, a PMOS transistor is referred to as a MOS transistor of a first type, while a NMOS transistor is referred to as a MOS transistor of a second type.

In this disclosure, a circuit is a collection of a transistor, a capacitor, a resistor, and/or other electronic devices interconnected in a certain manner to embody a certain function.

In this disclosure, a network is a circuit or a collection of circuits.

In this disclosure, a "circuit node" is frequently simply stated as a "node" for short, when what it means is clear from a context.

In this disclosure, a signal is a voltage of a variable level that carries a certain information and can vary with time. A level of the signal at a moment represents a state of the signal at that moment. In this present disclosure, "signal" and "voltage signal" refer to the same thing and thus are interchangeable.

Throughout this disclosure, a differential signaling scheme is widely used. When embodied in a differential signaling scheme, a signal comprises two voltages denoted with suffixes "+" and "−," respectively, attached in subscript, and a value of the signal is represented by a difference between said two voltages. For instance, a signal $V_A$ ($V_B$, $V_C$) in a differential signaling embodiment comprises two voltages $V_{A+}$ ($V_{B+}$, $V_{C+}$) and $V_{A-}$ ($V_{B-}$, $V_{C-}$) and a value of the signal $V_A$ ($V_B$, $V_C$) is represented by a difference between $V_{A+}$ ($V_{B+}$, $V_{C+}$) and $V_{A-}$ ($V_{B-}$, $V_{C-}$); $V_{A+}$ ($V_{B+}$, $V_{C+}$) is said to be a first end of $V_A$ ($V_B$, $V_C$); $V_{A-}$ ($V_{B-}$, $V_{C-}$) is said to be a second end of $V_A$ ($V_B$, $V_C$); the first end is also referred to as a positive end; the second end is also referred to as a negative end. A mean value of a first end and a second end of a signal in a differential signal embodiment is referred to as a "common-mode" voltage of said signal.

Figure 2:
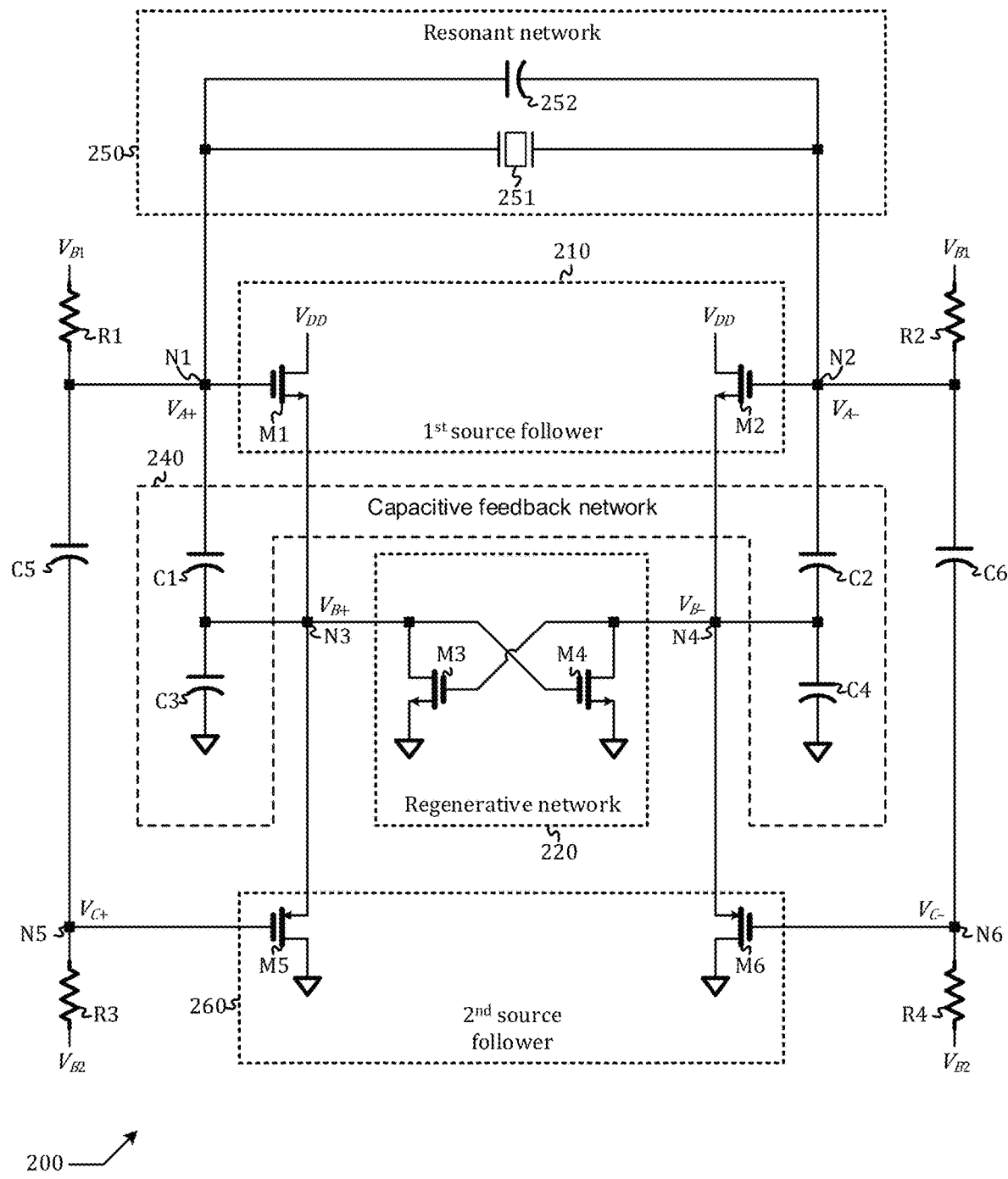
FIG. 2 shows a schematic diagram of a differential crystal oscillator in accordance with an embodiment of the present disclosure.

A schematic diagram of a differential crystal oscillator 200 in accordance with an embodiment of the present disclosure is shown in FIG. 2. Differential crystal oscillator 200 comprises: a first source follower 210 comprising two NMOS transistors including a first NMOS transistor M1 and a second NMOS transistor M2 configured to receive an oscillatory signal $V_A$ (which in a differential signal embodiment comprises two voltages including a first voltage $V_{A+}$ and a second voltage $V_{A-}$ at a first node N1 and a second node N2, respectively) and output a regenerated signal $V_B$ (which in a differential signal embodiment comprises two voltages including a third voltage $V_{B+}$ and a fourth voltage $V_{B-}$ at a third node N3 and a fourth node N4, respectively); a regenerative network 220 comprising two NMOS transistors including a third NMOS transistor M3 and a fourth NMOS transistor M4 configured in a cross-coupling topology between the third node N3 and the fourth node N4 to regenerate the regenerated signal $V_B$; a capacitive feedback network 240 comprising four capacitors including a first capacitor C1, a second capacitor C2, a third capacitor C3, and a fourth capacitor C4 configured to provide a feedback from the regenerated signal $V_B$ to the oscillatory signal $V_A$, where the third capacitor C3 and the fourth capacitor C4 are configured to shunt the third node N3 and the fourth node N4, respectively, to ground, while the first capacitor C1 and the second capacitor C2 are configured to couple the first node N1 and the second node N2 to the third node N3 and the fourth node N4, respectively; and a resonant network 250 comprising a parallel connection of a crystal 251 and a tuning capacitor 252 placed between the two nodes N1 and N2. Here, "$V_{DD}$" denotes a power supply node.

Differential crystal oscillator 200 further comprises two DC coupling resistors including a first DC coupling resistor R1 and a second DC coupling R2 configured to couple a first bias voltage $V_{B1}$ to the gates of the two NMOS transistors M1 and M2 to establish a biasing condition of the first source follower 210. The first source follower 210, regenerative network 220, and the capacitive feedback network 240 form a self-sustaining network to sustain an oscillation of the oscillatory signal $V_A$, while the resonant network 250 determines a frequency of the oscillation of the oscillatory signal $V_A$.

In a further embodiment, differential crystal oscillator 200 further comprises two AC-coupling capacitors comprising a first AC coupling capacitor C5 and a second AC coupling capacitor C6 configured to couple the oscillatory signal $V_A$ to an auxiliary oscillatory signal $V_C$ (which in a differential signal embodiment comprises two voltages including a fifth voltage $V_{C+}$ and a sixth voltage $V_{C-}$ at a fifth node N5 and a sixth node N6, respectively), and a second source follower 260 comprising two PMOS transistors including a first PMOS transistor M5 and a second PMOS transistor M6 configured to receive the auxiliary oscillatory signal $V_C$ and along with the first source follower 210 jointly regenerated the regenerated signal $V_B$. Differential crystal oscillator 200 further comprises another two DC coupling resistors including a third DC coupling resistor R3 and a fourth DC coupling resistor R4 configured to couple a second bias voltage $V_{B2}$ to gates of the two PMOS transistors M5 and M6 to establish a biasing condition of the second source follower 260.

An advantage of differential crystal oscillator 200 over the prior art differential crystal oscillator 100 is that a swing of the oscillatory signal $V_A$ can be larger due to that the oscillatory signal $V_A$ is established at gates of NMOS transistors M1 and M2 and thus not constrained by a pull-up or pull-down capability of a transistor.

Figure 3:
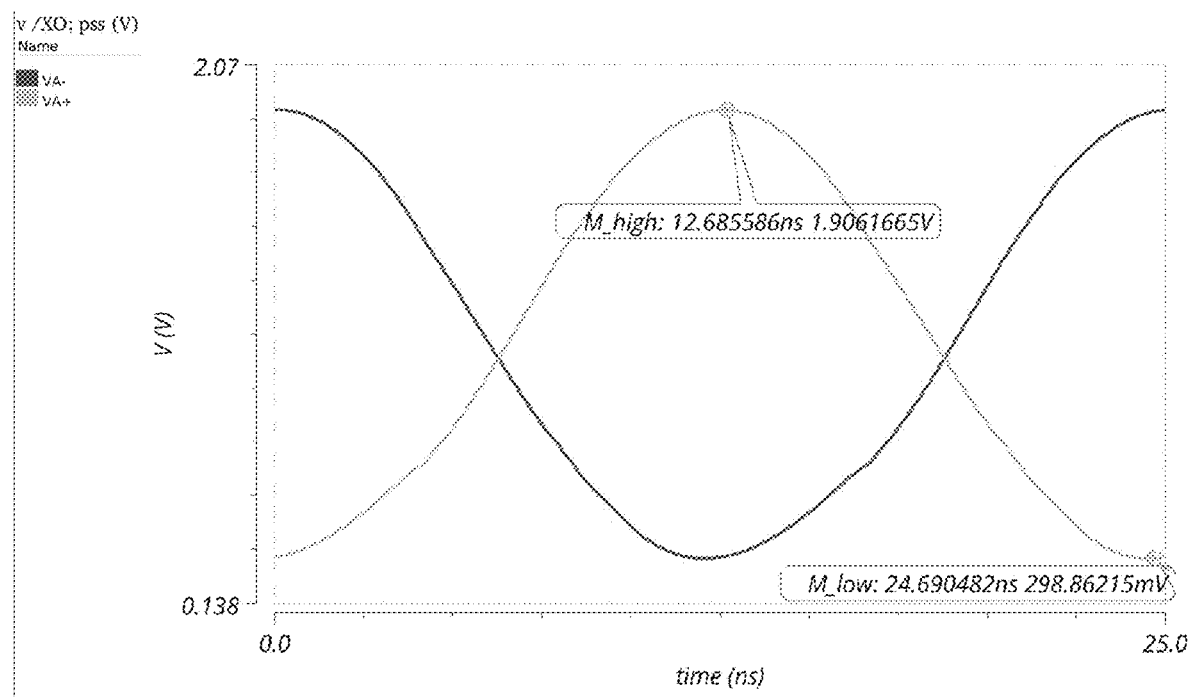
FIG. 3 shows a simulation result of a waveform of the differential crystal oscillator of FIG. 2.

By way of example but not limitation, in an embodiment: except for crystal 252, differential crystal oscillator 200 is integrated on a silicon substrate using a 55 nm CMOS process; a resonant frequency of crystal 251 is approximately 40 MHz; capacitor 251 is 5 pF; W/L (which stands for width/length) of NMOS transistors M1 and M2 are 56 μm/260 nm; W/L of NMOS transistors M3 and M4 are 28 μm/260 nm; W/L of PMOS transistors M5 and M6 are 70 μm/260 nm; capacitors C1, C2, C3, and C4 are all 10 pF; capacitors C5 and C6 are 2 pF; $V_{DD}$ is 1.2V; $V_{B1}$ is 1.2V; $V_{B2}$ is 0V; resistors R1, R2, R3, and R4 are all 200 KOhm. A simulated waveform of $V_{A+}$ and $V_{A-}$ over an oscillation cycle is shown in FIG. 3. As shown, $V_{A+}$ can swing approximately from 298 mV (M_low) to 1.9V (M_high), which is approximately 1.3V peak-to-peak. Using the same power supply voltage of 1.2V, a swing of $V_{osc+}$ in prior art differential crystal oscillator 100 is no more than the power supply voltage 1.2V, and probably only around 1V.

Resistors (such as R1, R2, R3, and R4) and capacitors (such as C1, C2, C3, C4, C5, C6, and tuning capacitor 252) can be implemented in various ways, and those skilled in the art can choose at their discretion.

While the resonant network 250 is shown to have a parallel connection of crystal 251 and the tuning capacitor 252, it is by example but not limitation. The resonant network 250 can be embodied by the same topology of the resonant network 110 of FIG. 1; that is, the tuning capacitor 252 is removed and replaced with two capacitors shunting the first node N1 and the second node N2, respectively, to ground. This is clear to those of ordinary skills in the art and thus not shown in figure. Also, there is no need for using the tuning capacitor 252 in the first place if an accuracy of an oscillation frequency of differential crystal oscillator 200 is already satisfactory.

It is known in the prior art that, for a given circuit comprising one or more NMOS transistors and one or more PMOS transistor working across a power supply node and a ground node, there exists a complementary circuit that can have the same function, wherein the complementary circuit can be constructed by replacing every NMOS transistor with a PMOS transistor, replacing every PMOS transistor with a NMOS transistor, and swapping the power supply node with the ground node. Using this technique, in an alternative embodiment not shown in figure but is clear to those of ordinary skills in the art, differential crystal oscillator 200 is converted to a complementary circuit, wherein every NMOS transistor is replaced by a PMOS transistor, every PMOS transistor is replaced by a NMOS transistor, and the power supply node $V_{DD}$ and the ground node are swapped. Note that voltage levels of $V_{B1}$ and $V_{B2}$ need to be adjusted to establish a proper biasing condition for the complementary circuit at a discretion of circuit designers.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A differential crystal oscillator comprising:
    a first source follower comprising a first MOS (metal-oxide semiconductor) transistor and a second MOS transistor of a first type configured to receive an oscillatory signal comprising a first voltage and a second voltage at a first node and a second node, respectively, and output a regenerated signal comprising a third voltage and a fourth voltage at a third node and a fourth node, respectively;
    a regenerative network comprising a third MOS transistor and a fourth MOS transistor of the first type configured in a cross-coupling topology between the third node and the fourth node to regenerate the regenerated signal;
    a capacitive feedback network comprises a first capacitor and a second capacitor configured to couple the first node and the second node to the third node and the fourth node, respectively and a third capacitor and a fourth capacitor configured to shunt the third node and the fourth node, respectively, to ground;
    a first DC (direct current) coupling resistor and a second DC coupling resistor configured to couple a first bias voltage to the first node and the second node, respectively; and
    a resonant network comprising a crystal placed between the first node and the second node.

2. The differential crystal oscillator of claim 1, wherein the first MOS transistor, the second MOS transistor, the third MOS transistor, and the fourth MOS transistor of the first type are NMOS (n-channel metal oxide semiconductor) transistors.

3. The differential crystal oscillator of claim 1, wherein the first MOS transistor, the second MOS transistor, the third MOS transistor, and the fourth MOS transistor of the first type are PMOS (p-channel metal oxide semiconductor) transistors.

4. The differential crystal oscillator of claim 1 further comprising first a AC (alternate current) coupling capacitor and a second AC coupling capacitor configured to couple the first node and the second node to a fifth node and a sixth node, respectively, an second source follower comprising a fifth MOS transistor and a sixth MOS transistor of a second type configured to receive an auxiliary oscillatory signal comprising a fifth voltage and a sixth voltage at the fifth node and the sixth node, respectively, and along with the first source follower jointly output the regenerated signal comprising the third voltage and the fourth voltage at the third node and the fourth node, respectively, and a third DC coupling resistor and a fourth DC coupling resistor configured to couple a second bias voltage to the fifth node and the sixth node, respectively.

5. The differential oscillator of claim 1, wherein the resonant network further comprises a tuning capacitor placed between the first node and the second node.

6. A differential crystal oscillator comprising:
    a first source follower configured to receive an oscillatory signal and output a regenerated signal;
    a resonant network comprising a crystal and configured to terminate the oscillatory signal and determine an oscillation frequency of the oscillatory signal;
    a regenerative network configured to regenerate the regenerated signal;
    a capacitive feedback network configured to provide a feedback from the regenerated signal to the oscillatory signal; and an AC (alternate current) coupling network configured to couple the oscillatory signal to an auxiliary oscillatory signal, and a second source follower configured to receive the auxiliary oscillatory signal and along with the first source follower jointly output the regenerated signal.

7. The differential crystal oscillator of claim 6, wherein the first source follower comprises a first MOS (metal oxide semiconductor) transistor and a second MOS transistor of a first type configured to receive a first end and a second end of the oscillatory signal at a first node and a second node, respectively, and output a first end and a second end of the regenerated signal at a third node and a fourth node, respectively.

8. The differential crystal oscillator of claim 7, wherein the regenerative network comprises a third MOS transistor and a fourth MOS transistor of the first type configured in a cross-coupling topology to regenerate the regenerated signal.

9. The differential crystal oscillator of claim 8, wherein the capacitive feedback comprises a first capacitor and a second capacitor configured to couple the first node and the second node to the third node and the fourth node, respectively, and a third capacitor and a fourth capacitor configured to shunt the third node and the fourth node, respectively, to ground.

10. The differential crystal oscillator of claim 9, wherein the first MOS transistor, the second MOS transistor, the third MOS transistor, and the fourth MOS transistor of the first type are NMOS (n-channel metal oxide semiconductor) transistors.

11. The differential crystal oscillator of claim 9, wherein the first MOS transistor, the second MOS transistor, the third MOS transistor, and the fourth MOS transistor of the first type are PMOS (p-channel metal oxide semiconductor) transistors.

12. A differential crystal oscillator comprising:
a first source follower configured to receive an oscillatory signal and output a regenerated signal;
a resonant network comprising a crystal and configured to terminate the oscillatory signal and determine an oscillation frequency of the oscillatory signal;
a regenerative network configured to regenerate the regenerated signal;
a capacitive feedback network configured to provide a feedback from the regenerated signal to the oscillatory signal; and
an AC (alternate current) coupling network configured to couple the oscillatory signal to an auxiliary oscillatory signal, and a second source follower configured to receive the auxiliary oscillatory signal and along with the first source follower jointly output the regenerated signal,
wherein the first source follower comprises a first MOS (metal oxide semiconductor) transistor and a second MOS transistor of a first type configured to receive a first end and a second end of the oscillatory signal at a first node and a second node, respectively, and output a first end and a second end of the regenerated signal at a third node and a fourth node, respectively;
wherein the regenerative network comprises a third MOS transistor and a fourth MOS transistor of the first type configured in a cross-coupling topology to regenerate the regenerated signal;
wherein the capacitive feedback comprises a first capacitor and a second capacitor configured to couple the first node and the second node to the third node and the fourth node, respectively, and a third capacitor and a fourth capacitor configured to shunt the third node and the fourth node, respectively, to ground.

13. The differential oscillator of claim 12, wherein the auxiliary oscillatory signal comprises a first end and a second end at a fifth node and a sixth node, respectively, the AC coupling network comprises a first AC coupling capacitor and a second AC coupling capacitor configured to couple the first node and the second node to the fifth node and the sixth node, respectively.

14. The differential oscillator of claim 13, wherein the second source follower comprises a fifth MOS transistor of a second type configured to receive the first end of the auxiliary oscillatory signal and along with the first MOS transistor of the first type output the first end of the regenerated signal, and a sixth MOS transistor of a second type configured to receive the second end of the auxiliary oscillatory signal and along with the second MOS transistor of the first type output the second end of the regenerated signal.

15. The differential crystal oscillator of claim 14, wherein the first MOS transistor, the second MOS transistor, the third MOS transistor, and the fourth MOS transistor of the first type are NMOS (n-channel metal oxide semiconductor) transistors, while the fifth MOS transistor and the sixth MOS transistor of the second type are PMOS (p-channel metal oxide semiconductor) transistors.

16. The differential crystal oscillator of claim 14, wherein the first MOS transistor, the second MOS transistor, the third MOS transistor, and the fourth MOS transistor of the first type are PMOS (p-channel metal oxide semiconductor) transistors, while the fifth MOS transistor and the sixth MOS transistor of the second type are NMOS (n-channel metal oxide semiconductor) transistors.

* * * * *